(12) United States Patent
Kobatake

(10) Patent No.: US 7,911,870 B2
(45) Date of Patent: Mar. 22, 2011

(54) FUSE DATA READ CIRCUIT HAVING CONTROL CIRCUIT BETWEEN FUSE AND CURRENT MIRROR CIRCUIT

(75) Inventor: Hiroyuki Kobatake, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 158 days.

(21) Appl. No.: 12/385,844

(22) Filed: Apr. 21, 2009

(65) Prior Publication Data

US 2009/0285036 A1 Nov. 19, 2009

(30) Foreign Application Priority Data

May 16, 2008 (JP) ................................ 2008-129871

(51) Int. Cl.
*G11C 17/18* (2006.01)
(52) U.S. Cl. ................. 365/225.7; 365/189.09; 365/226
(58) Field of Classification Search ............. 365/189.05, 365/189.09, 227.5, 205; 257/528–529; 327/525
See application file for complete search history.

(56) References Cited

U.S. PATENT DOCUMENTS

| 6,125,069 | A | 9/2000 | Aoki |
| 6,201,750 | B1 * | 3/2001 | Busch et al. ................ 365/225.7 |
| 6,236,241 | B1 * | 5/2001 | Liu et al. ......................... 326/121 |
| 7,495,310 | B2 * | 2/2009 | Douzaka et al. ............... 257/529 |

FOREIGN PATENT DOCUMENTS

JP        2000-200497        7/2000

* cited by examiner

*Primary Examiner* — Gene N. Auduong
(74) *Attorney, Agent, or Firm* — McGinn IP Law Group, PLLC

(57) ABSTRACT

A fuse data read circuit includes a fuse data holding unit which holds fuse data, a fuse data read unit which detects fuse data, and a bias voltage generating circuit which generates a bias voltage. The fuse data read unit includes a current mirror circuit and a control circuit provided between the current mirror circuit and the fuse data holding unit. The bias voltage generating circuit applies the bias voltage to the control circuit.

9 Claims, 8 Drawing Sheets

US 7,911,870 B2

FUSE DATA READ CIRCUIT HAVING CONTROL CIRCUIT BETWEEN FUSE AND CURRENT MIRROR CIRCUIT

INCORPORATION BY REFERENCE

This application is based upon and claims the benefit of priority from Japanese Patent Application No. 2008-129871 which was filed on May 16, 2008, the disclosure of which is incorporated herein in its entirety by reference.

BACKGROUND OF THE INVENTION

1. Field of the Invention

The present invention relates to a fuse data read circuit.

2. Description of Related Art

With advancement of semiconductor technologies, there has been known a technique for expanding the storage capacity of a semiconductor storage by increasing the number of storage elements incorporated in the semiconductor storage. In some cases, storage elements incorporated in a semiconductor memory device may include a storage element that does not operate properly (hereinafter referred to as a bad memory cell).

If a proportion of the bad memory cells to the entire storage elements is high, then the yield of the semiconductor memory devices decreases. A technique for preventing a reduction in the yield has been known in which redundant memory cells (hereinafter referred to as spare memory cells) are provided in a predetermined area in a semiconductor storage and are used to replace the bad memory cells (refer to Patent Document 1, for example).

When bad memory cells are replaced with spare memory cells, the addresses of the bad memory cells are stored in fuses. A semiconductor storage causes the fuses to store the addresses of the bad memory cells to be replaced with the spare memory cells, by turning ON (not disconnecting)/OFF (disconnecting) redundancy fuses in the fuse window. The semiconductor storage built in an electronic device replaces the bad memory cells with the spare memory cells and performs read/write operations, when power of the electronic device is turned on.

(Patent Document 1) Japanese Patent Application Laid Open No. 2000-200497

SUMMARY

With increasing memory capacity, the number of spare memory cells and the number of address signals have been increasing. Thus, a large number of fuses need to be used in order to replace one bad memory cell with a spare memory cell. As the number of fuses increases, signal lines connected to the fuses grow in length and parasitic capacitance of wiring increases, which thus may cause a failure in reading ON/OFF of the fuse. In addition, since an electric current flows to read ON/OFF of the fuse every time an address signal is supplied to a memory, current consumption may also increase.

As to an exemplary aspect, a fuse data read circuit includes a fuse data holding unit for holding fuse data, a fuse data read unit for detecting fuse data, and a bias voltage generating circuit for generating a bias voltage. The fuse data read unit of the fuse data read circuit includes a current mirror circuit and a control circuit provided between the current mirror circuit and the fuse data holding unit. The bias voltage generating circuit applies the bias voltage to the control circuit.

When an output voltage of the fuse data read circuit is at Low level, the output voltage is equal to or lower than the difference between the bias voltage Vbias and a threshold voltage Vth.

According to the exemplary aspect, a fuse data read circuit can reduce a current consumption. In addition, a fuse data read circuit can operate with a high precision while suppressing an increase in a circuit area.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
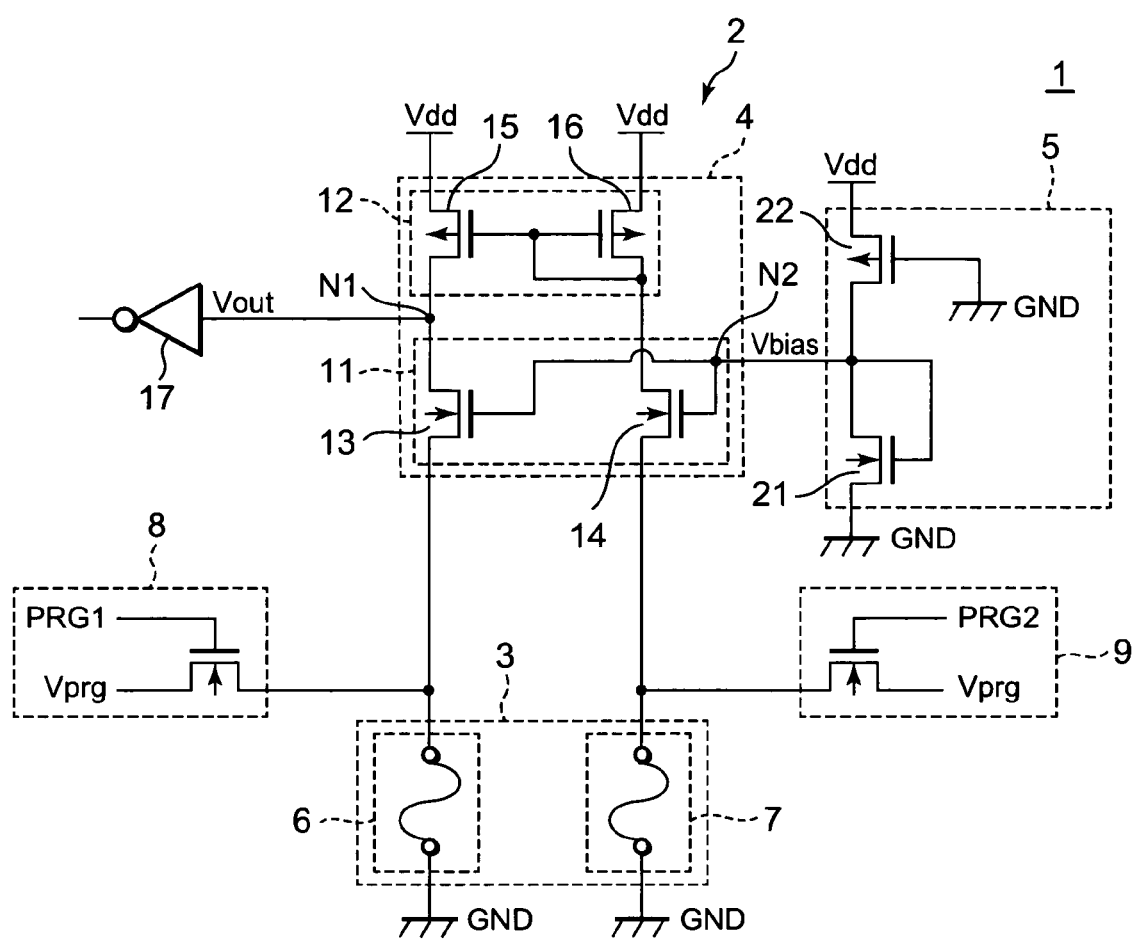
FIG. 1 is a circuit diagram illustrating a configuration of a fuse data read circuit 2 of a first exemplary embodiment.

FIG. 1 is a circuit diagram illustrating a configuration of the fuse data read circuit 2 of an exemplary embodiment. The fuse data read circuit 2 of the exemplary embodiment is formed on a semiconductor integrated circuit 1 including multiple memory cells (not shown) and multiple spare memory cells (not shown). The fuse data read circuit 2 includes a data holding unit 3, a data read unit 4, and a bias voltage generating circuit 5. In addition, the fuse data read circuit 2 is connected to a first data write circuit 8 and a second data write circuit 9.

The data holding unit 3 includes a first fuse element 6 and a second fuse element 7. The first fuse element 6 is connected to the first data write circuit 8, while the second fuse element 7 is connected to the second data write circuit 9. Responding to a write voltage Vprg supplied from the first data write circuit 8, the first fuse element 6 holds fuse data. Similarly, responding to a write voltage Vprg supplied from the second data write circuit 9, the second fuse element 7 holds fuse data. Responding to a first programming signal PRG1, the first data write circuit 8 outputs a write voltage Vprg. Similarly, responding to a second programming signal PRG2, the second data write circuit 9 outputs a write voltage Vprg. The data read unit 4 is connected to an output circuit (inverter) 17. The output circuit (inverter) 17 receives an output voltage Vout supplied from the data read unit 4.

As shown in FIG. 1, the data read unit 4 includes an output voltage control circuit 11 and a current mirror 12. The output voltage control circuit 11 includes a control circuit first transistor 13 and a control circuit second transistor 14. A gate of the control circuit first transistor 13 is connected to the bias voltage generating circuit 5 by way of a second node N2. Similarly, a gate of the control circuit second transistor 14 is connected to the bias voltage generating circuit 5 by way of the second node N2.

The current mirror 12 includes a current mirror first transistor 15 and a current mirror second transistor 16. Gates of the current mirror first transistor 15 and the current mirror second transistor 16 are connected to form a short circuit. A power supply end of the current mirror first transistor 15 is connected to a power wire and receives supply voltage Vdd. An earthing end of the current mirror first transistor 15 is connected to the output voltage control circuit 11 by way of a first node N1. In addition, the current mirror first transistor 15 is connected to the output circuit (inverter) 17 by way of the first node N1. A power supply end of the current mirror second transistor 16 is connected to the power source and receives supply voltage Vdd. An earthing end of the current mirror second transistor 16 is connected to the control circuit second transistor 14. In addition, an earthing end of the current mirror second transistor 16 is short circuited to its gate.

A gate-source voltage Vgs of the current mirror first transistor 15 depends on a current flowing through the current mirror second transistor 16. Since a gate-drain voltage Vgd of the current mirror second transistor 16 is 0V, a source-drain voltage Vds of the current mirror first transistor 15 and the gate-source voltage Vgs of the current mirror first transistor 15 are uniquely determined when a drain current Id of the current mirror second transistor 16 is determined. In addition, a bias voltage Vbias satisfies:

Bias voltage Vbias≦Supply voltage Vdd

The bias voltage generating circuit 5 includes a bias circuit first transistor 21 and a bias circuit second transistor 22. The bias circuit first transistor 21 has a same threshold voltage as the control circuit first transistor 13 or the control circuit second transistor 14. In addition, the bias circuit second transistor 22 acts as a load device. An earthing end of the bias circuit first transistor 21 is connected to an earthing conductor and receives a ground voltage GND. A power supply end of the bias circuit first transistor 21 is connected to an earthing end of the bias circuit second transistor 22. In addition, a power supply end of the bias circuit second transistor 22 is short circuited to a gate. The power supply end of the bias circuit first transistor 21 is connected to the control circuit first transistor 13 and the control circuit second transistor 14 by way of the second node N2. The power supply end of the bias circuit second transistor 22 is connected to the power wire and receives the supply voltage Vdd. In addition, a gate of the bias circuit second transistor 22 is connected to the earthing wire.

Figure 2:
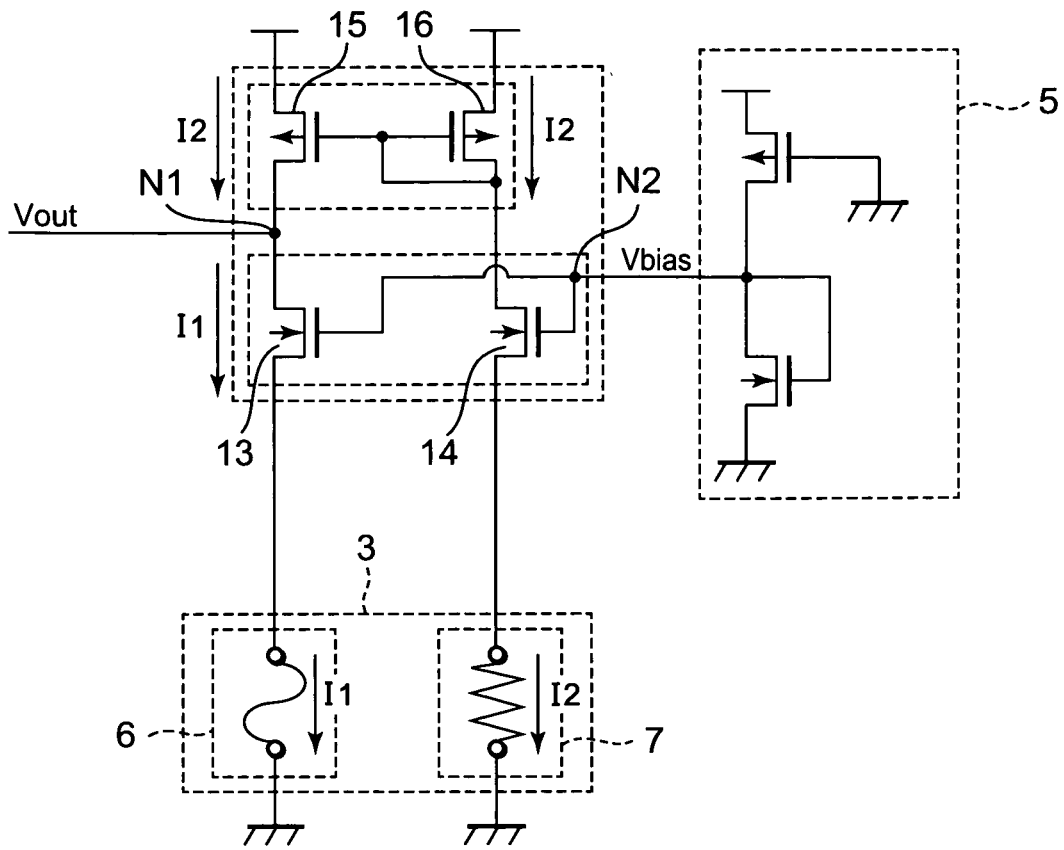
FIG. 2 is a diagram illustrating an operation when fuse data held in a data holding unit 3 is read out.

FIG. 2 is a view illustrating an operation when fuse data held in the data holding unit 3 is read out. The data holding unit 3 shown in FIG. 2 holds fuse data by a second fuse element 7 becoming high resistance (or disconnected). Here, when a first current I1 denotes a current flowing through a first fuse element 6 of the data holding unit 3, and a second current I2 denotes a current flowing through the second fuse element 7, the following expression is satisfied:

First current I1>Second current I2

As shown in FIG. 2, the second current I2 flows through the second fuse element 7 of the data holding unit 3, the control circuit second transistor 14 and the current mirror second transistor 16 of the data read unit 4. In addition, the first current I1 flowing through the first fuse element 6 also flows through the control circuit first transistor 13. Now, a gate-source voltage Vgs is applied to the current mirror first transistor 15 so that a saturation current value will be same as the second current I2.

Figure 3:
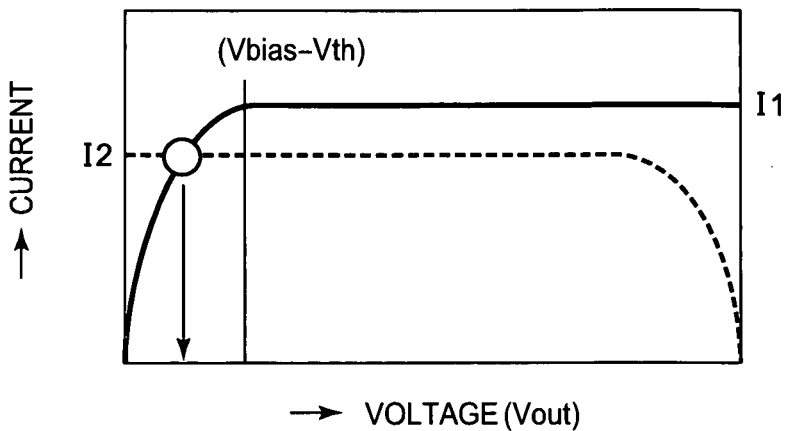
FIG. 3 is a graph illustrating the operation when a second fuse element 7 is high in resistance (or disconnected)

FIG. 3 is a graph illustrating the operation when the second element 7 is high in resistance (or disconnected). A horizontal axis of FIG. 3 represents an output voltage Vout, while a vertical axis represents a drain current of the control circuit first transistor 13. A dotted line of FIG. 3 represents an operating curve of the current mirror first transistor 15. Now, since a drain of the current mirror first transistor 15 and a drain of the control circuit first transistor 13 are connected by the node N1, in practice, the transistors 13 and 15 operate with a drain current and a drain voltage determined by an intersecting point of a solid line and the dotted line in FIG. 3. In other words, a drain potential of the current mirror first transistor 15 is same as a drain potential of the control circuit first transistor 13, and the drain current of the current mirror first transistor 15 is also same as the drain current of the control circuit first transistor 13.

A gate voltage Vg of the control circuit first transistor 13 is fixed to a bias voltage Vbias. In addition, a source of the control circuit first transistor 13 is connected to the first fuse element 6. The first fuse element 6 has a predetermined resistance value. Thus, operation of the control circuit first transistor 13 shown by the solid line of FIG. 3 corresponds with the operating curve of the transistor, the transistor having its source connected to a resistance. As shown in FIG. 3, an intersecting point of these operating curves is an operating point of the control circuit first transistor 13 and the current mirror first transistor 15. In fact, an actual output voltage Vout is provided with a voltage indicated by the intersecting point of the operating curves.

The gate-source voltage Vgs of the current mirror first transistor 15 is determined depending on a gate-source voltage Vgs of the current mirror second transistor 16 determined by the resistance value of the second fuse element 7, and a saturation current value indicated by the operating curve of the dotted line in FIG. 3 rises and falls. In addition, due to a resistance value of the first fuse element 6, rising characteristics and the saturation current value of the control circuit first transistor 13 indicated by operating curve rise and fall. Thus, when the second fuse element 7 is high in resistance and the first fuse element 6 is low in resistance, the operating curve of the saturation current indicated by the solid line is higher than the operating curve of the saturation current indicated by the dotted line, as shown in FIG. 3. Since an intersecting point of the dotted line and the solid line is in a rising area of the operating curve indicated by the solid line, the actual output voltage Vout is a low voltage value.

A bias voltage Vbias is applied to the gates of the control circuit first transistor 13 and the control circuit second transistor 14, respectively. Here, assume that a threshold voltage of the control circuit first transistor 13 or the control circuit second transistor 14 is a threshold voltage Vth, and a threshold voltage of the bias circuit first transistor 21 is the threshold voltage Vth. In this case, the output voltage Vout is (bias voltage Vbias−threshold voltage Vth) or lower when the output voltage Vout is at Low level.

When the output voltage Vout of (bias voltage Vbias−threshold voltage Vth) or lower is outputted, it becomes easy for the output circuit (inverter) 17 to receive the output voltage Vout. In addition, voltage to be supplied to the first fuse element 6 or the second fuse element 7 becomes also (bias voltage Vbias−threshold voltage Vth) or lower, and the circuit currents (first current I1, second current I2) are also reduced.

Figure 4:
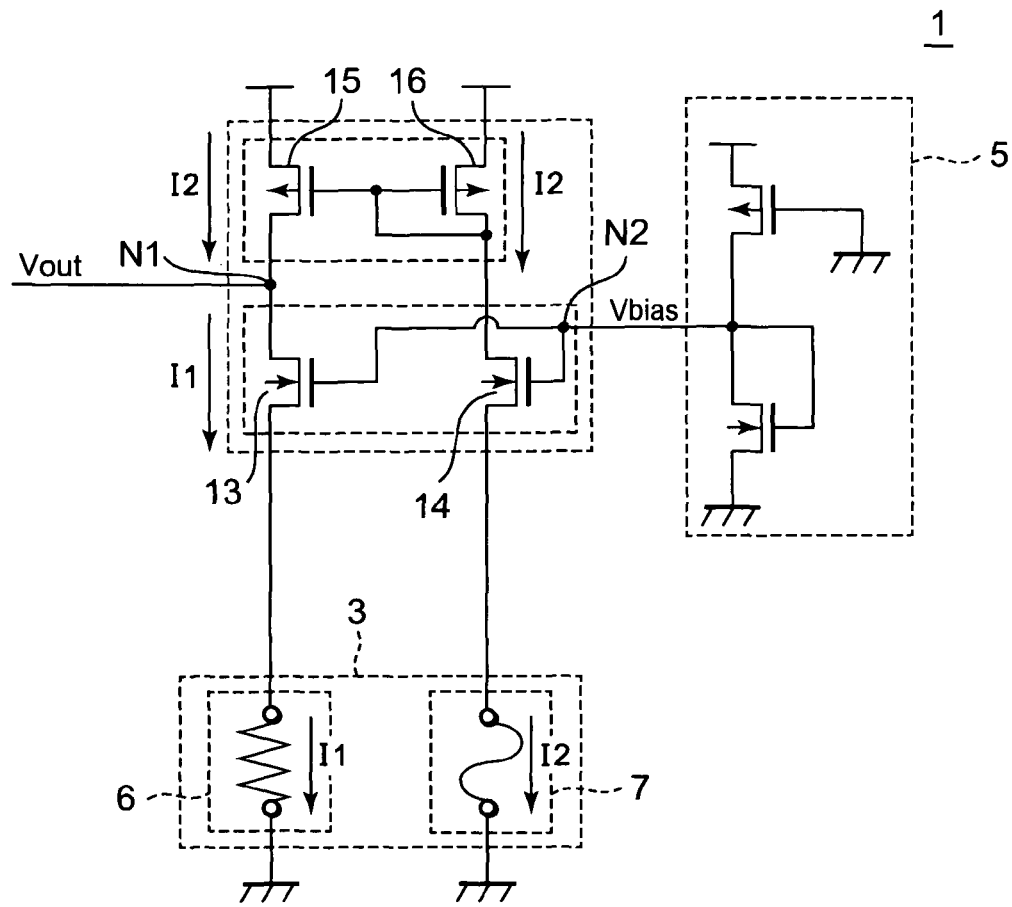
FIG. 4 is a diagram illustrating an operation when the fuse data held in the data holding unit 3 is read out.

FIG. 4 is a view illustrating an operation when fuse data held in the data holding unit 3 is read out. The data holding unit 3 shown in FIG. 4 holds fuse data by the first fuse element 6 becoming high resistance (or disconnected). Here, when the first current I1 denotes a current flowing through the first fuse element 6 of the data holding unit 3, and the second current I2 denotes a current flowing through the second fuse element 7, the following expression is satisfied:

First current I1<Second current I2.

As shown in FIG. 4, the second current I2 flows through the second fuse element 7 of the data holding unit 3, the control circuit second transistor 14 and the current mirror second transistor 16 of the data read unit 4. In addition, at this time (when the current flowing through the current mirror second transistor 16 of the data read unit 4 is the second current I2), a current value of the current mirror first transistor 15 is also equal to the second current I2. The second current I2 flowing through the current mirror first transistor 15 flows through the second fuse element 7. At this time, the first current I1 flowing through the first fuse element 6 also flows through the control circuit first transistor 13.

Even when the first fuse element 6 is high in resistance (or disconnected), the gate-source voltage Vgs of the current mirror first transistor 15 depends on a current flowing through the current mirror second transistor 16. Since the gate-drain voltage Vgd of the current mirror second transistor 16 is 0V, a source-drain voltage Vds of the current mirror first transistor 15 and a gate-source voltage Vgs of the current mirror first transistor 15 are uniquely determined when a drain Id of the current mirror second transistor 16 is determined.

Figure 5:
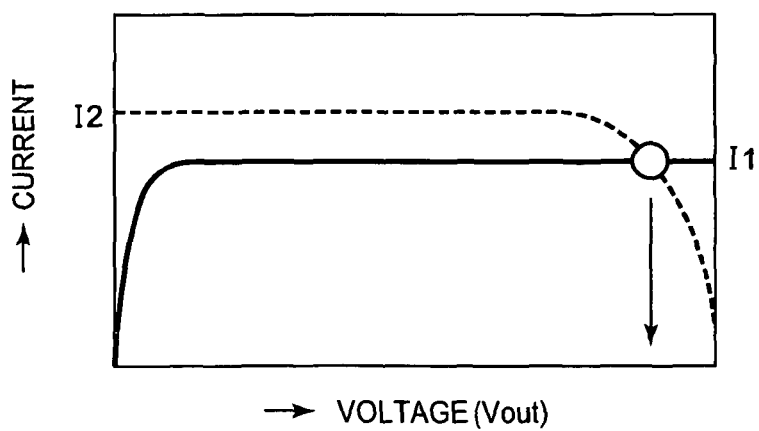
FIG. 5 is a graph illustrating the operation when a first fuse element 6 is high in resistance (disconnected)

FIG. 5 is a graph illustrating the operation when the first fuse element 6 is high in resistance (or disconnected). A dotted line of FIG. 5 represents an operating curve of the current mirror first transistor 15, while a solid line represents an operating curve of the control circuit first transistor 13. As shown in FIG. 5, since high resistance is applied to the source of the control circuit first transistor 13 when the first fuse element 6 is high in resistance (or disconnected), a saturation current value decreases substantially. As a result, as shown in FIG. 5, since the operating point falls within the rising area (desaturated area) of the operating curve indicated by the dotted line, the output voltage Vout outputs High level.

As described above, the fuse data read circuit 2 includes the data read unit 4 for reading out data (fuse data) held in the data holding unit 3. The data read unit 4 includes the current mirror first transistor 15 and the current mirror second transistor 16 being connected in a manner so as to be a current mirror. In addition, the data read unit 4 includes the control circuit first transistor 13 and the control circuit second transistor 14. The data read unit 4 also comprises the control circuit first transistor 13 and the control circuit second transistor 14. They cause the data read unit 4 to act as a comparator.

When the data read unit 4 includes the control circuit first transistor 13 and the control circuit second transistor 14 that receive a lower voltage (bias voltage Vbias) than a supply voltage VDD at the gates, the fuse data read circuit 2 having an accurate judgment threshold value can be formed without increasing the circuit area. In addition, an increase in current consumption for the fuse data read circuit 2 is suppressed.

In addition, the bias voltage generating circuit 5 for generating a bias voltage Vbias is formed of a transistor having a same threshold voltage Vth as the control circuit first transistor 13 or the control circuit second transistor 14. This enables the bias voltage generating circuit 5 to stably generate the bias voltage Vbias.

Second Exemplary Embodiment

Figure 6:
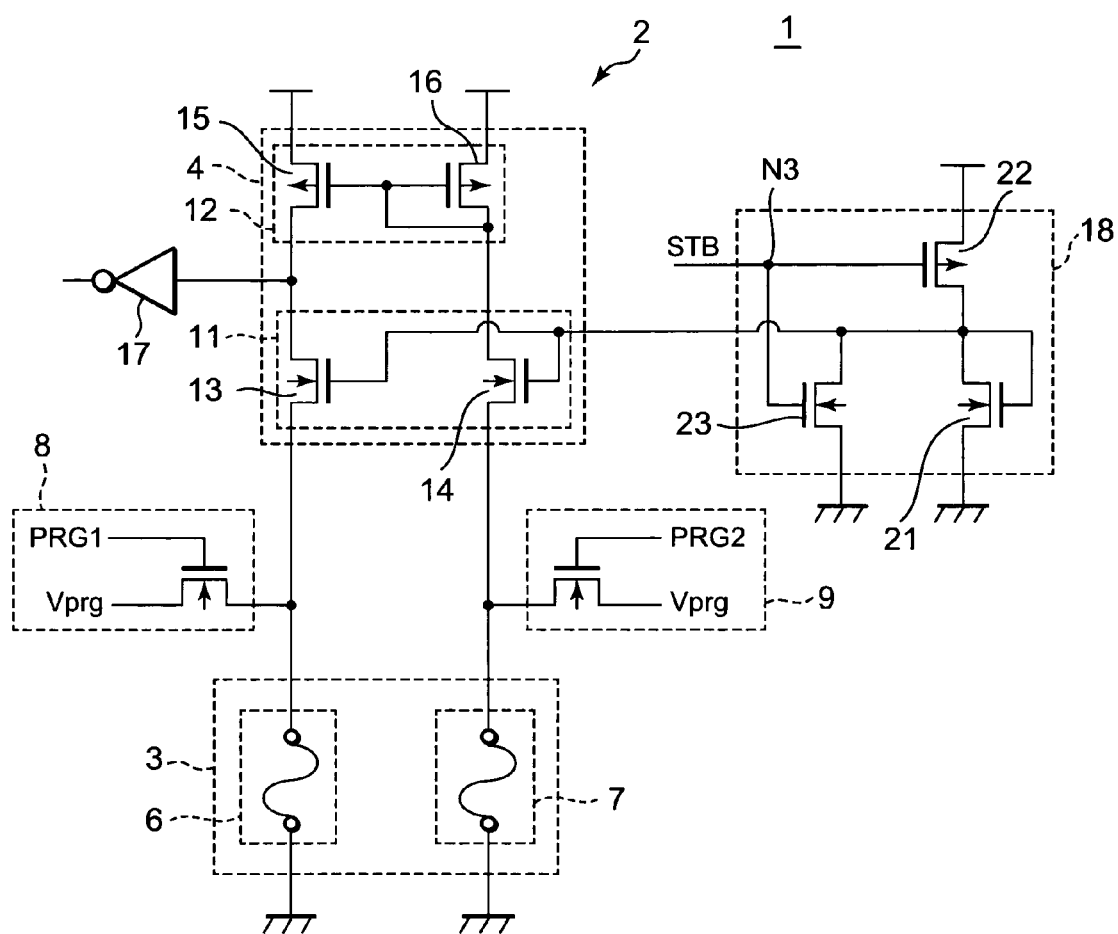
FIG. 6 is a circuit diagram illustrating a configuration of a fuse data read circuit 2 of a second exemplary embodiment.

FIG. 6 is a circuit diagram illustrating a configuration of a fuse data read circuit 2 of a second exemplary embodiment. The fuse data read circuit 2 of the second exemplary embodiment includes a bias generating circuit 18 having a different configuration from the bias voltage generating circuit 5 illustrated in the first exemplary embodiment. The bias generating circuit 18 includes a bias circuit first transistor 21, a bias circuit second transistor 22, and a bias prohibit circuit 23. A gate of the bias circuit second transistor 22 is connected to a third node N3. In addition, a gate of the bias prohibit circuit 23 is connected to the third node N3, and a power supply end (drain) of the bias prohibit circuit 23 is connected to gates of a control circuit first transistor 13 and a control circuit second transistor 14.

As shown in FIG. 6, a standby signal STB is supplied to the third node N3. Responding to the standby signal STB, the bias generating circuit 18 stops supply of a bias voltage Vbias. This enables the fuse data read circuit 2 of the second exemplary embodiment to perform a switch between standby state and normal state, and thereby suppress an increase in power consumption during standby.

Third Exemplary Embodiment

Figure 7:
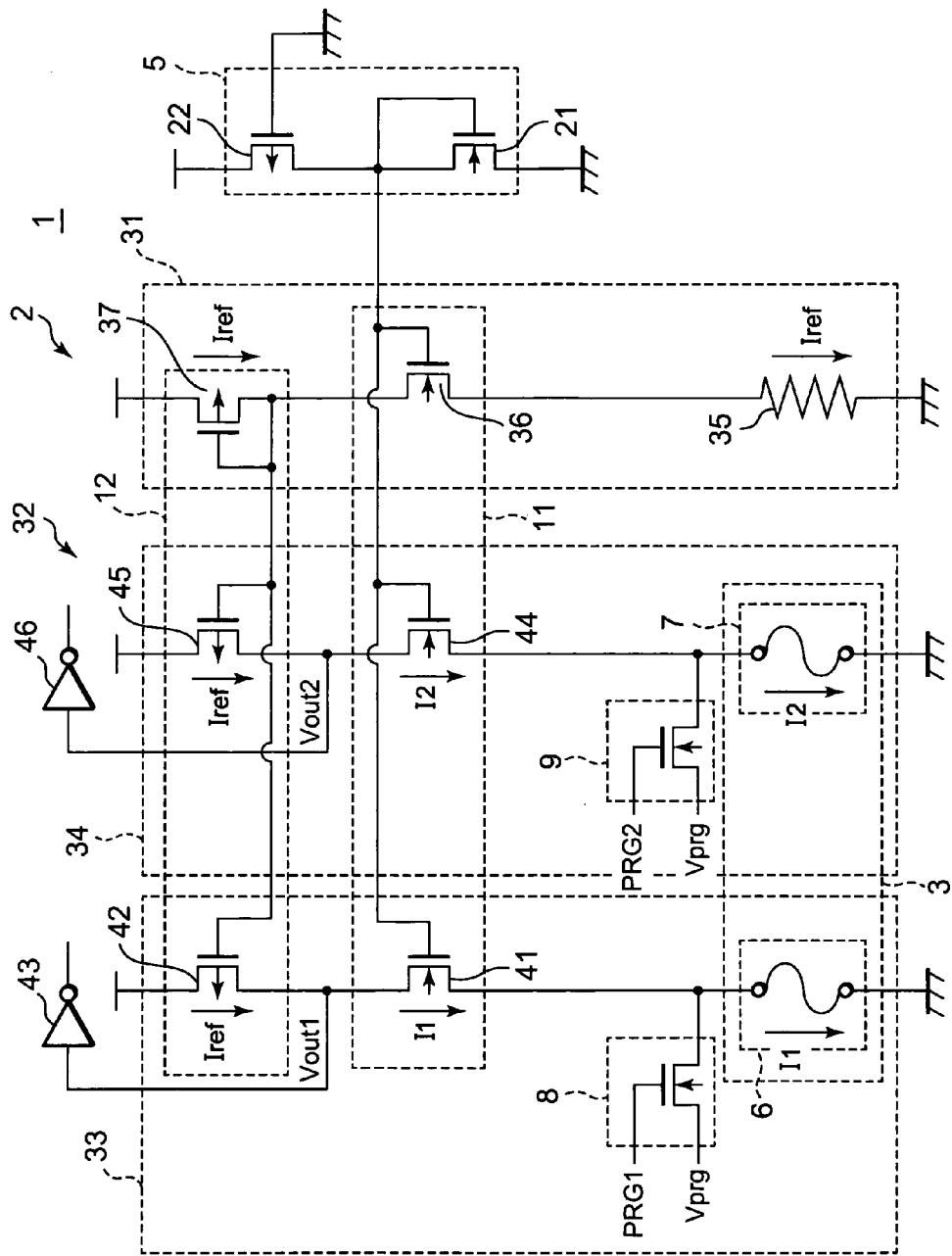
FIG. 7 is a circuit diagram illustrating a configuration of a fuse data read circuit 2 of a third exemplary embodiment.

FIG. 7 is a circuit diagram illustrating a configuration of the fuse data read circuit 2 in a semiconductor integrated circuit 1 of a third exemplary embodiment. The fuse data read circuit 2 of the third exemplary embodiment includes a reference current generating circuit 31 and a read circuit group 32. The read circuit group 32 includes multiple data output circuits. In the following exemplary embodiment, in order to facilitate understanding of the exemplary embodiment, a case where the read circuit group 32 includes two data output circuits (first data output circuit 33, second data output circuit 34) is illustrated. The fuse data read circuit 2 of the third exemplary embodiment achieves similar circuit configuration to that of the fuse data read circuit 2 of the first exemplary embodiment (or the second exemplary embodiment) by a combination of the reference current generating circuit 31 and one of the multiple data output circuits included in the read circuit group 32.

As shown in FIG. 7, the first data output circuit 33 in the third exemplary embodiment outputs a first output voltage Vout1 to a first output circuit (inverter) 43. Similarly, a second data output circuit 34 outputs a second output voltage Vout2 to a second output circuit (inverter) 46. In addition, the reference current generating circuit 31 includes a resistance 35, a reference current circuit first transistor 36, and a reference current circuit second transistor 37, and generates a reference current Iref.

The first data output circuit 33 includes a control circuit first transistor 41 and a current mirror first transistor 42. The reference current circuit second transistor 37 and the current mirror first transistor 42 forms a current mirror 12, and a current having a same value as the reference current Iref flows through the current mirror first transistor 42. A bias voltage Vbias supplied from the bias voltage generating circuit 5 is applied to a gate of the control circuit first transistor 41. The second data output circuit 34 includes a control circuit second transistor 44 and a current mirror second transistor 45. The reference current circuit second transistor 37 and the current mirror second transistor 45 forms a current mirror 12, and a current having a same value as the reference current Iref flows through the current mirror second transistor 45. A bias voltage Vbias supplied from the bias voltage generating circuit 5 is applied to a gate of the control circuit first transistor 41.

According to the configuration described above, in the read circuit group 32 of the third exemplary embodiment, a read circuit formed of the reference current generating circuit 31 and the first data output circuit 33 and a read circuit formed of the reference current generating circuit 31 and the second data output circuit 34 can be driven independently from each other.

Figure 8:
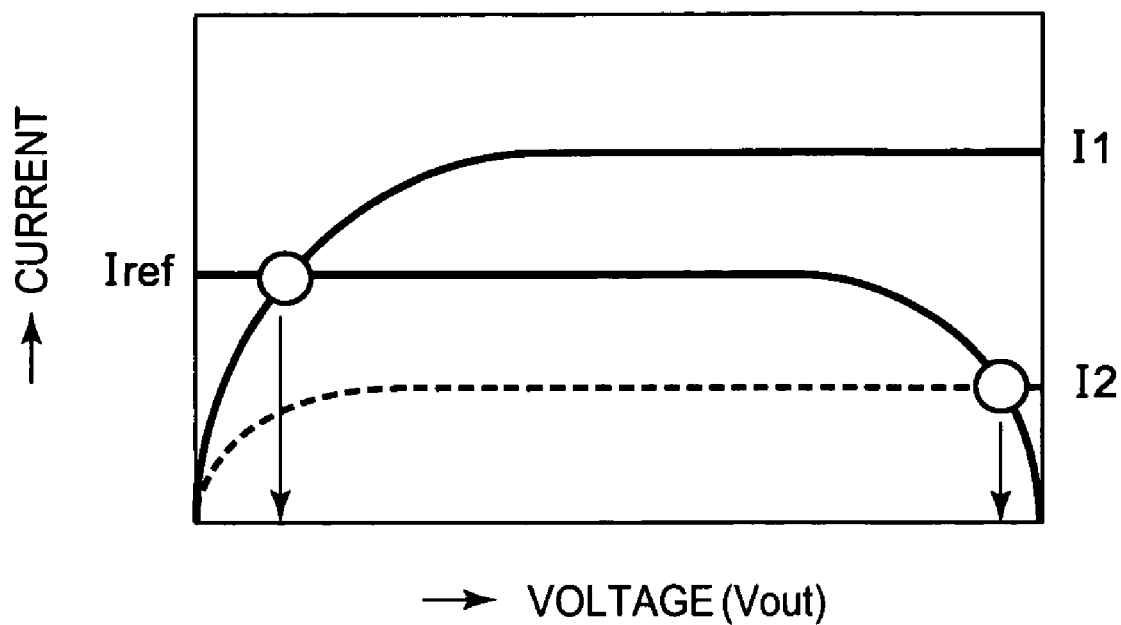
FIG. 8 is a graph illustrating an operation of the fuse data read circuit 2 of the third exemplary embodiment.

FIG. 8 is a graph illustrating an operation of the fuse data read circuit 2 of the third exemplary embodiment. A dotted line of FIG. 8 represents an operating curve of the control circuit first transistor 41, and a solid line represents an operating curve of the control circuit second transistor 44. Note that, FIG. 8 illustrates operation when the second fuse element 7 of the first data output circuit 33 is disconnected (or made high resistance) in the read circuit group 32 of the third exemplary embodiment. As shown in FIG. 8, when the second fuse element 7 is high in resistance (or disconnected), a second current I2<the reference current Iref, and the second output voltage Vout2 outputs High level. At this time, a first output voltage Vout1 becomes Low level, and the first output voltage Vout1 becomes (bias voltage Vbias−threshold voltage Vth) or lower.

In the read circuit group 32 of the third exemplary embodiment, when the first output voltage Vout1 that is (bias voltage Vbias−threshold voltage Vth) or lower is outputted, the first output circuit (inverter) 43 can easily receive the first output voltage Vout1. In addition, a voltage supplied to the first fuse element 6 or the second fuse element 7 also becomes (bias voltage Vbias−threshold voltage Vth) or lower, and circuit currents (first current I1, second current I2) are also reduced. Furthermore, the semiconductor integrated circuit 1 of the third exemplary embodiment can include multiple read circuits while suppressing an increase in the circuit area.

Fourth Exemplary Embodiment

Figure 9:
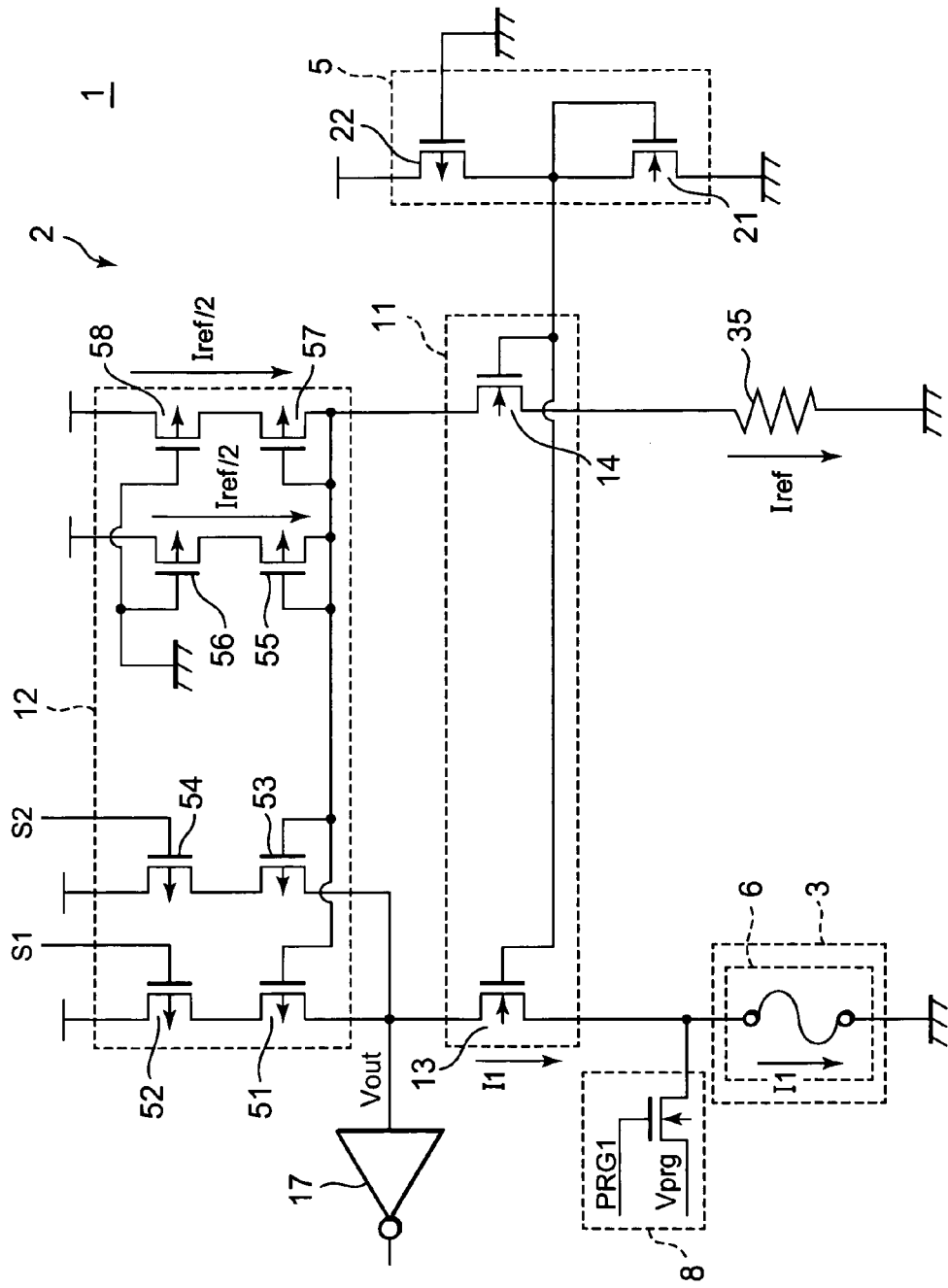
FIG. 9 is a circuit diagram illustrating a configuration a fuse data read circuit 2 of a fourth exemplary embodiment.

FIG. 9 is a circuit diagram illustrating a configuration of a fuse data read circuit 2 in a semiconductor integrated circuit 1 of a fourth exemplary embodiment. The current mirror first transistor 15 in the current mirror 12 of the first exemplary embodiment is configured as multiple transistors in the fuse data read circuit 2 of the fourth exemplary embodiment. In addition, the fuse data read circuit 2 of the fourth exemplary embodiment has multiple transistors configure the current mirror second transistor 16 in the current mirror 12 of the first exemplary embodiment. Note that, in the fourth exemplary embodiment, in order to facilitate understanding of the exemplary embodiment, a case in which the fuse data read circuit 2 includes a resistance 35 is illustrated.

As shown in FIG. 9, the current mirror 12 of the fourth exemplary embodiment includes a first PMOS transistor 51, a second PMOS transistor 52, a third PMOS transistor 53, a fourth PMOS transistor 54, a fifth PMOS transistor 55, a sixth PMOS transistor 56, a seventh PMOS transistor 57, and an eighth PMOS transistor 58.

The second PMOS transistor 52 performs switching of activation/deactivation in response to a first control signal S1 applied to its gate. The fourth PMOS transistor 54 performs switching of activation/deactivation in response to a second control signal S2 applied to its gate.

Gates of the first PMOS transistor 51 and the third PMOS transistor 53, and the gates of the fifth PMOS transistor 55 and the seventh PMOS transistor 57 are connected to form short circuits, respectively. The gates of PMOS transistor 51, 53, 55 and 57 are connected to a power supply end (drain) of the control circuit second transistor 14. In addition, the fifth PMOS transistor 55 has a gate and an earthing (grounding) end (drain) to form a short circuit. Similarly, the seventh PMOS transistor 57 has a gate and an earthing end (drain) to form a short circuit.

If a current flowing through the resistance 35 is a reference current Iref when the fifth PMOS transistor 55, the sixth PMOS transistor 56, the seventh PMOS transistor 57, and the eighth PMOS transistor 58 are transistors having a similar configuration, then a current (hereinafter referred to as a switching reference current Iref/2) having a value half of the reference current Iref flows through the eighth PMOS transistor 58 and the seventh PMOS transistor 57. Similarly, the switching reference current Iref/2 flows through the fifth PMOS transistor 55 and the sixth PMOS transistor 56.

Figure 10:
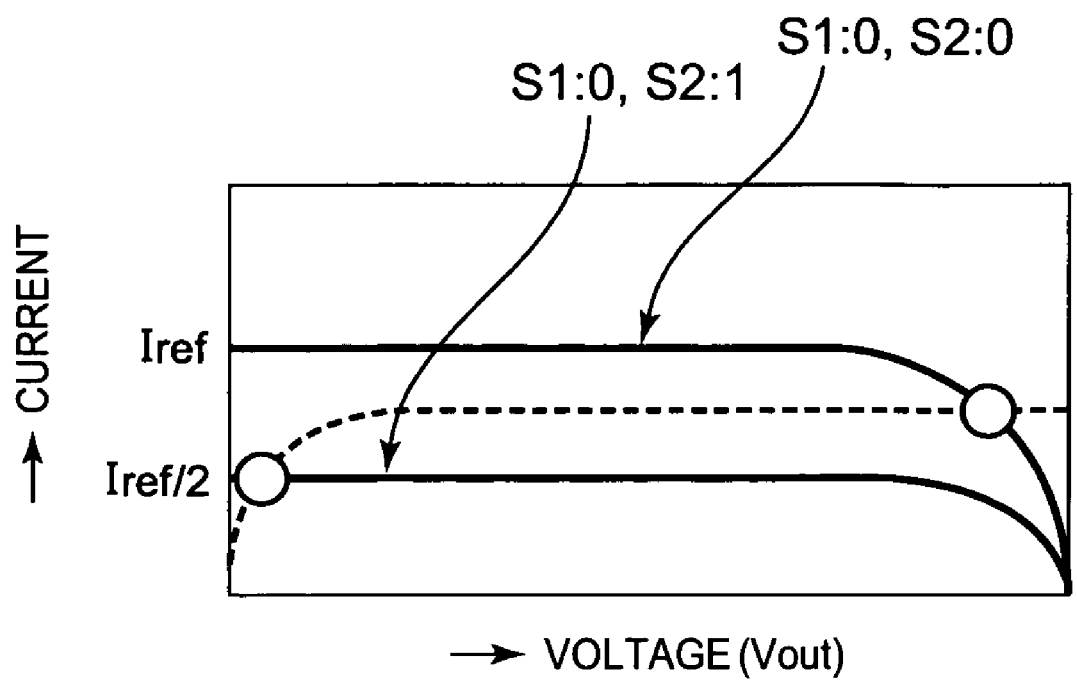
FIG. 10 is a graph illustrating an operation of the fuse data read circuit 2 of the fourth exemplary embodiment.

FIG. 10 is a graph illustrating an operation of the fuse data read circuit 2 of the fourth exemplary embodiment. A solid line in the upper part of FIG. 10 illustrates operation of a semiconductor integrated circuit 1 when both a first control signal S1 and a second control signal S2 are at Low level. A solid line in the lower part of FIG. 10 illustrates operation of the semiconductor integrated circuit 1 when the first control signal S1 is at Low level and the second control signal S2 is at High level.

As shown in FIG. 10, the fuse data read circuit 2 of the fourth exemplary embodiment has multiple judging levels. The semiconductor integrated circuit 1 can switch between the multiple determination levels by switching the levels of the first control signal S1 and the second control signal S2.

Note that, in the multiple exemplary embodiments described above, the current mirrors 12 are formed of P channel transistors, and the output voltage control circuits 11 are formed of N channel transistors. This configuration dose not limit the configuration of the output voltage control circuit 11 or the current mirror 12. Even when the current mirror 12 is formed of the N channel transistor, or when the output voltage control circuit 11 is formed of the P channel transistor, for example, it is possible to configure a semiconductor integrated circuit 1 having the same action and effect described above. In addition, the multiple exemplary embodiments described above can be combined and implemented, to the extent that their configurations and operations do not conflict.

Further, it is noted that Applicant's intent is to encompass equivalents of all claim elements, even if amended later during prosecution.

What is claimed is:

1. A fuse data read circuit, comprising:
   a fuse data holding unit which holds a fuse data;
   a fuse data read unit which detects the fuse data; and
   a bias voltage generating circuit which generates a bias voltage,
   wherein the fuse data read unit includes:
      a current mirror circuit; and
      a control circuit provided between the current mirror circuit and the fuse data holding unit, and
   wherein the bias voltage generating circuit applies the bias voltage to the control circuit.

2. The fuse data read circuit according to claim 1, wherein the control circuit includes a control transistor, and
   the bias voltage generating circuit applies, as the bias voltage, a voltage having a value between a first supply voltage and a ground voltage to a gate of the control transistor.

3. The fuse data read circuit according to claim 2, wherein wherein the bias voltage generating circuit includes:

a load device; and a bias generating transistor connected to the load device.

4. The fuse data read circuit according to claim 1, wherein the bias voltage generating circuit includes:

a load device; and a bias generating transistor connected to the load device, and wherein the bias generating transistor has a same threshold voltage as a threshold voltage of a transistor of the fuse data read unit.

5. The fuse data read circuit according to claim 1, wherein, the bias voltage generating circuit includes a switch, and the switch prohibits an output of the bias voltage in response to a standby signal.

6. The fuse data read circuit according to claim 1, wherein the fuse data read unit further includes:

a first transistor that receives the bias voltage and supplies a first current outputted from the current mirror circuit to the fuse data holding unit; and a second transistor that receives the bias voltage and supplies a second current outputted from the current mirror circuit to the fuse data holding unit, and wherein the fuse data holding unit includes:

a first fuse element that receives the first current; and a second fuse element that receives the second current.

7. The fuse data read circuit according to claim 1, further comprising:

a reference current generating circuit which generates a reference current, wherein the control circuit includes:

a control transistor that receives the bias voltage and supplies a first current based on the reference current to the fuse data holding unit.

8. The fuse data read circuit according to claim 1, wherein the fuse data read unit further includes:

a switch which changes an amount of current flowing from the current mirror circuit to the control circuit, in response to a level selection signal.

9. A fuse data read circuit, comprising:

a first fuse coupled to a first power source terminal supplied with a first power source;

a second fuse coupled to the first power source terminal;

a current mirror circuit coupled to a second power source terminal supplied with a second power source higher than the first power source;

a first transistor coupled between the first fuse and a first node of the current mirror circuit; and a second transistor coupled between the second fuse and a second node of the current mirror circuit, the first and second transistors receiving a voltage lower than the second power source and higher than the first power source at control gates of the first and second transistors.

* * * * *